United States Patent
Wang

(10) Patent No.: US 7,229,879 B2
(45) Date of Patent: Jun. 12, 2007

(54) METAL-INSULATOR-METAL (MIM) CAPACITOR STRUCTURE FORMED WITH DUAL DAMASCENE STRUCTURE

(75) Inventor: Sung Hsiung Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/286,999

(22) Filed: Nov. 22, 2005

(65) Prior Publication Data

US 2006/0071262 A1    Apr. 6, 2006

Related U.S. Application Data

(62) Division of application No. 10/791,246, filed on Mar. 1, 2004, now Pat. No. 7,038,266.

(51) Int. Cl.
*H01L 21/8234* (2006.01)
*H01L 21/8244* (2006.01)
*H01L 21/8242* (2006.01)
*H01L 21/20* (2006.01)

(52) U.S. Cl. ................ 438/253; 438/238; 438/387

(58) Field of Classification Search ........ 438/253–254, 438/396–398, 238; 257/295–310
See application file for complete search history.

(56) References Cited

U.S. PATENT DOCUMENTS

| 6,492,222 B1 * | 12/2002 | Xing ........................ 438/240 |
| 6,734,079 B2 * | 5/2004 | Huang et al. ............... 438/396 |
| 2006/0166430 A1 * | 7/2006 | Rinerson et al. ........... 438/216 |

* cited by examiner

*Primary Examiner*—Cuong Nguyen
(74) *Attorney, Agent, or Firm*—Tung & Associates

(57) ABSTRACT

A microelectronic product and a method for fabricating the same each provide a capacitor formed interposed between a first dielectric layer and a second dielectric layer formed over a substrate having a first contact region and a second contact region exposed therein. The capacitor is also connected to a first conductor stud that penetrates the first dielectric layer and contacts the first contact region and a second conductor stud that penetrates the second dielectric layer. A contiguous conductor interconnect and conductor stud layer is formed within a dual damascene aperture through the second dielectric layer and the first dielectric layer and contacting the second contact region. An etch stop layer employed when forming a trench within the dual damascene aperture also passivates a capacitor sidewall.

6 Claims, 1 Drawing Sheet ized glass (FSG) dielectric material deposited to a thickness of from about 3000 to about 8000 angstroms.

METAL-INSULATOR-METAL (MIM) CAPACITOR STRUCTURE FORMED WITH DUAL DAMASCENE STRUCTURE

This is a divisional of application Ser. No. 10/791,246 filed on Mar. 1, 2004 now U.S. Pat. No. 7,038,266.

BACKGROUND OF THE INVENTION

1. Field of the Invention

The invention relates generally to capacitor structures formed within microelectronic products. More particularly, the invention relates to methods for efficiently integrating capacitor structures formed within microelectronic products.

2. Description of the Related Art

Capacitors are frequently employed within microelectronic products. They often serve digital data storage functions. They may also serve analog or digital signal processing functions. Although they are often critical components within integrated circuits, integration of capacitors within microelectronic products is nonetheless not entirely without problems.

The invention is thus directed towards efficiently integrating capacitor structures within microelectronic products.

SUMMARY OF THE INVENTION

A first object of the invention is to provide a capacitor structure within a microelectronic product.

A second object of the invention is to provide a capacitor structure in accord with the first object of the invention, where the capacitor structure is efficiently integrated into the microelectronic product.

In accord with the objects of the invention, the invention provides a microelectronic product having a capacitor formed therein, and a method for fabricating the microelectronic product having the capacitor formed therein.

In accord with the invention, the microelectronic product comprises a substrate having a first contact region and a laterally (i.e., horizontally) separated second contact region exposed therein. A first dielectric layer is formed over the substrate including the first contact region and the second contact region. A second dielectric layer is formed over the first dielectric layer. A capacitor is formed interposed between the first dielectric layer and the second dielectric layer. The capacitor is also sandwiched between: (1) a first conductor stud that penetrates the first dielectric layer and contacts the first contact region; and (2) a second conductor stud that penetrates the second dielectric layer. Finally, the microelectronic product comprises a contiguous conductor interconnect and conductor stud layer that contacts the second contact region and is formed into a trench defined within the second dielectric layer and a contiguous via defined within the first dielectric layer.

The invention provides a capacitor structure efficiently integrated into a microelectronic product.

The invention realizes the foregoing object by forming a capacitor structure in conjunction with a dual damascene conductor structure within a microelectronic product.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a capacitor structure efficiently integrated into a microelectronic product.

The invention realizes the foregoing object by forming a capacitor structure in conjunction with a dual damascene conductor structure within a microelectronic product.

FIG. 1 to FIG. 4 show a series of schematic cross-sectional diagrams illustrating the results of progressive stages in fabricating a microelectronic product in accord with a preferred embodiment of the invention.

Figure 1:
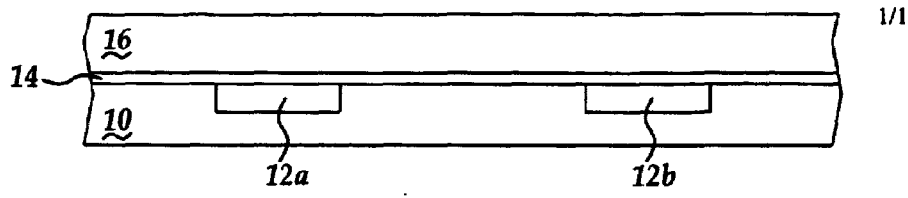
FIG. 1, FIG. 2, FIG. 3 and FIG. 4 show a series of schematic cross-sectional diagrams illustrating the results of progressive stages in fabricating a microelectronic product in accord with a preferred embodiment of the invention.

FIG. 1 shows a substrate 10. The substrate 10 has a pair of contact regions 12a and 12b formed laterally separated and exposed therein. An optional blanket barrier layer 14 is formed upon the substrate 10 and the exposed pair of contact regions 12a and 12b. Finally, a blanket first dielectric layer 16 is formed upon the blanket barrier layer 14.

The substrate 10 may be employed in any of several microelectronic products, including but not limited to integrated circuit products, ceramic substrate products and opto-electronic products. The substrate 10 may consist of or comprise layers of any of several types of microelectronic materials, including but not limited to conductor materials, semiconductor materials and dielectric materials. Preferably, the substrate 10 comprises a semiconductor substrate. The semiconductor substrate preferably has several layers formed thereover, including dielectric layers and conductor layers such as to provide the contact regions 12a and 12b.

The contact regions 12a and 12b may be either semiconductor contact regions (when the substrate consists of or comprises a semiconductor substrate or a semiconductor layer) or conductor contact regions. Typically, the contact regions 12a and 12b are formed of a bidirectional linewidth of from about 0.1 to about 1.0 microns. Preferably, the contact regions 12a and 12b are conductor contact regions typically comprising copper or copper containing conductor materials.

The optional blanket barrier layer 14 is generally employed under circumstances where the pair of contact regions 12a and 12b is formed of a copper conductor material. Under such circumstances, the blanket barrier layer 14 is typically formed of a dielectric barrier material such as silicon nitride or silicon oxynitride, such as to inhibit inter-diffusion of copper from the contact regions 12a and 12b with a dielectric material from which is formed the blanket first dielectric layer 16. Typically, the blanket barrier layer 14 is formed to a thickness of from about 200 to about 500 angstroms.

The blanket first dielectric layer 16 may be formed of comparatively higher dielectric constant dielectric materials (i.e., having a dielectric constant greater than about 4) such as silicon oxide dielectric materials. The blanket first dielectric layer 16 may also be formed of comparatively lower dielectric constant dielectric materials (i.e., having a dielectric constant less than about 4) such as spin-on-polymer (SOP) dielectric materials, spin-on-glass (SOG) dielectric materials, amorphous carbon dielectric materials and fluorosilicate glass (FSG) dielectric materials. Preferably, the blanket first dielectric layer 16 is formed from a fluorosilicate glass (FSG) dielectric material formed to a thickness of from about 4000 to about 8000 angstroms.

Figure 2:
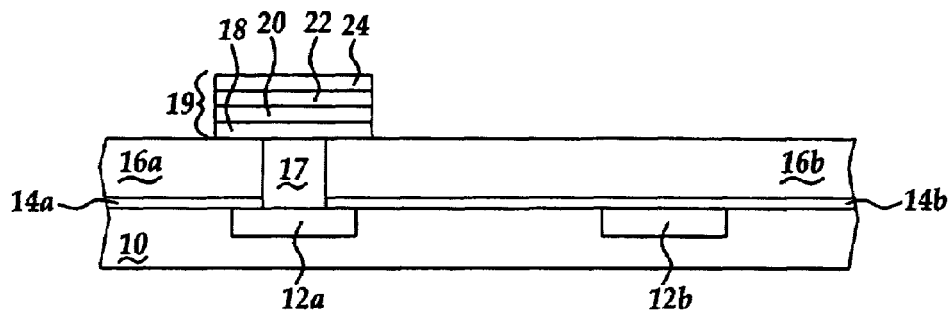

FIG. 2 shows the results of etching the blanket first dielectric layer 16 and the blanket barrier layer 14 to form a pair of patterned first dielectric layers 16a and 16b and a pair of patterned barrier layers 14a and 14b that in an aggregate form a first via. A first conductor stud layer 17 is formed into the first via and reaching to the top of the pair of patterned first dielectric layers 16a and 16b. FIG. 2 also illustrates a capacitor structure 19 contacting the first conductor stud 17. The capacitor structure 19 comprises in planar layered succession: (1) a first capacitor plate 18 formed upon the pair of patterned first dielectric layers 16a and 16b and contacting the first conductor stud 17; (2) a capacitor dielectric layer 20 formed upon the first capacitor plate 18; (3) a second capacitor plate 22 formed upon the capacitor dielectric layer 20; and (4) an optional anti-reflective coating layer 24 formed upon the second capacitor plate 22. The optional anti-reflective coating layer 24 derives from a blanket anti-reflective coating layer that was employed in defining a patterned photoresist layer in-turn employed as an etch mask layer for forming the capacitor structure 19 from a corresponding series blanket layers.

The blanket first dielectric layer 16 and the blanket barrier layer 14 are both typically patterned to form the corresponding patterned layers while employing an anisotropic plasma etch method. The first conductor stud 17 may be formed of a copper core material layer laminated to a barrier material liner layer. Other conductor materials may alternatively be employed. Each of the first capacitor plate 18 and the second capacitor plate 20 may be formed from any of several capacitor plate materials, including but not limited to doped polysilicon (having a dopant concentration of greater than about 1E20 dopant atoms per cubic centimeter), polycide (doped polysilicon/metal silicide stack), metal and metal alloy (including nitride alloy) capacitor plate materials. Preferably, each of the first capacitor plate 18 and the second capacitor plate 22 is formed of a tantalum nitride capacitor plate material formed to a thickness of from about 500 to about 1000 angstroms. The capacitor dielectric layer 20 may be formed from any of several capacitor dielectric materials. The capacitor dielectric materials may include comparatively low dielectric constant dielectric materials (i.e., having a dielectric constant less than about 10 such as silicon oxide, silicon nitride and silicon oxynitride dielectric materials) and comparatively high dielectric constant dielectric materials (i.e., having a dielectric constant greater than about 10 such as barium strontium titanate (BST) dielectric materials and lead zirconate titanate (PZT) dielectric materials). Preferably the capacitor dielectric layer 20 is formed of a silicon oxide dielectric material formed to a thickness of from about 100 to about 500 angstroms. The optional anti-reflective coating layer 24 may be formed to a thickness of from about 100 to about 500 angstroms from any of several anti-reflective coating (ARC) materials, including organic polymer anti-reflective coating materials and silicon oxynitride anti-reflective coating (ARC) materials.

Figure 3:
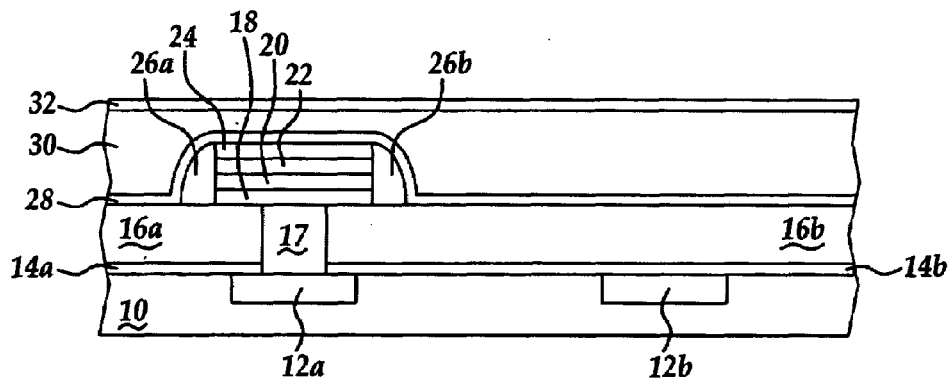

FIG. 3 first shows a pair of spacer layers 26a and 26b formed adjoining and passivating a pair of sidewalls of the capacitor structure 19. The pair of spacer layers 26a and 26b is of necessity formed of a dielectric spacer material such as to avoid electrical shorting within the capacitor structure 19. A silicon oxide dielectric spacer material is typically employed such as to provide optimal dielectric isolation. The pair of spacer layers 26a and 26b is preferably formed employing an anisotropic etching of a blanket spacer material layer.

A blanket etch stop layer 28 is formed upon exposed portions of the pair of patterned first dielectric layers 16a and 16b, the pair of spacer layers 26a and 26b and the anti-reflective coating (ARC) layer 24. The blanket etch stop layer 28 is typically formed of a dielectric material, such as a silicon nitride or silicon oxynitride dielectric material, although other materials may also be employed. Typically, the blanket etch stop layer 28 is formed to a thickness of from about 200 to about 1000 angstroms. In addition to providing an etch stop function within the microelectronic product of FIG. 3, the blanket etch stop layer 28 also provides additional and more remote sidewall passivation and barrier properties for the capacitor structure 19. The barrier properties are intended to inhibit diffusion of impurities into the spacer layers 26a and 26b.

FIG. 3 next shows a blanket second dielectric layer 30 formed upon the blanket etch stop layer 28. FIG. 3 finally shows a blanket planarizing stop layer 32 formed upon the blanket second dielectric layer 20.

The blanket second dielectric layer 30 may be formed of dielectric materials analogous, equivalent of identical to the dielectric materials employed for forming the blanket first dielectric layer 16. Preferably, the blanket second dielectric layer 30 is also formed of a fluorinated silicon glass (FSG) dielectric material, and formed to a thickness of from about 4000 to about 8000 angstroms. Under such circumstances, the blanket etch stop layer 28 provides diffusion inhibition for free fluorine from the blanket second dielectric layer 30 into the pair of spacer layers 26a and 26b, which would otherwise compromise performance of the capacitor structure 19. The blanket planarizing stop layer 32 is typically formed of a silicon nitride material formed to a thickness of from about 200 to about 500 angstroms, although other planarizing stop materials may also be employed.

Figure 4:
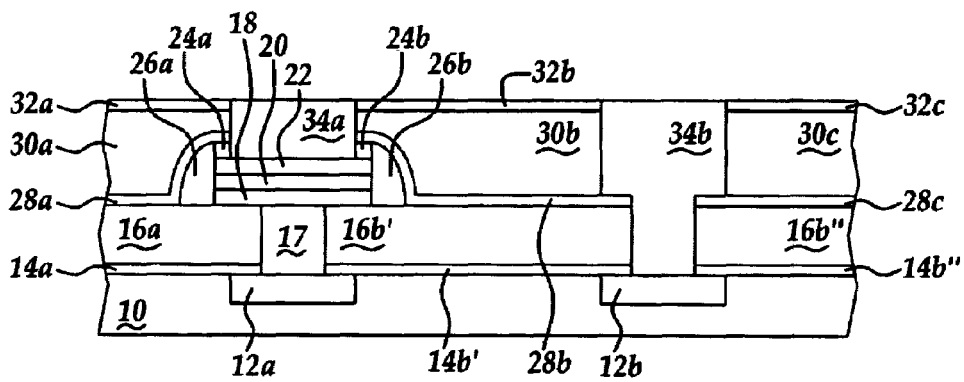

FIG. 4 first shows the results of: (1) forming a second via through the blanket planarizing stop layer 32, the blanket second dielectric layer 30 and the anti-reflective layer 24 to reach the second capacitor plate 22; and (2) forming a dual damascene aperture (i.e., a trench contiguous with a via) through the blanket planarizing stop layer 32, the blanket second dielectric layer 30, the blanket etch stop layer 28, the patterned first dielectric layer 16b and the patterned barrier layer 14b. The results of forming the second via and the dual damascene aperture provide: (1) a series of patterned planarizing stop layers 32a, 32b and 32c; (2) a series of patterned second dielectric layers 30a, 30b and 30c; (3) a series of patterned etch stop layers 28a, 28b and 28c; (4) a pair of patterned anti-reflective layers 24a and 24b; (5) a pair of patterned first dielectric layers 16b' and 16b''; and (6) a pair of patterned barrier layers 14b' and 14b'', from corresponding layers prior to patterning. The patterning may be undertaken employing methods as are conventional in the art.

With respect to forming the dual damascene aperture, and as is understood by a person skilled in the art, the dual damascene aperture is formed employing a two-step etch method. One step within the two-step etch method defines the trench dimensions within the second dielectric layer while a second step in the etch method defines the via dimensions within the first dielectric layer. The invention is operative in either permutation of trench etch first or via etch first. However, the second via accessing the second capacitor plate 22 is typically formed simultaneously with the via etch when forming the dual damascene aperture, since a need to etch through the blanket etch stop layer 28 exists in both of those circumstances. Thus, within the invention, the blanket etch stop layer 28 serves as a trench floor within a dual damascene aperture (i.e., for etch stop purposes when forming a trench within a dual damascene aperture), as well as a remote passivation layer for passivating a sidewall of a capacitor structure within the microelectronic product as illustrated in FIG. 4.

FIG. 4 finally shows a second conductor stud 34*a* formed into the second via and a contiguous conductor interconnect and conductor stud 34*b* formed into the dual damascene aperture. The second conductor stud 34*a* and the contiguous conductor interconnect and conductor stud layer 34*b* are typically formed simultaneously employing a planarizing method, such as a chemical mechanical polish (CMP) planarizing method. They are typically also formed of a copper or copper alloy conductor material layer laminated to a barrier material layer.

FIG. 4 illustrates a microelectronic product formed in accord with a preferred embodiment of the invention. The microelectronic fabrication comprises a capacitor interposed between a pair of conductor studs that penetrate a pair of dielectric layers that are also separated by the capacitor. The microelectronic product also comprises a dual damascene aperture and contiguous conductor interconnect and conductor stud layer formed through the pair of dielectric layers. Within the microelectronic fabrication, an etch stop layer employed for forming a trench within the dual damascene aperture also passivates a sidewall of the capacitor.

The preferred embodiment of the invention is illustrative of the invention rather than limiting of the invention. Revisions and modifications may be made to methods, materials, structures and dimensions of the microelectronic fabrication in accord with the preferred embodiment of the invention, while still providing a microelectronic product in accord with the invention, further in accord with the accompanying claims.

What is claimed is:

1. A method for fabricating a microelectronic product comprising:
   providing a substrate having exposed therein a first contact region and a second contact region;
   forming a first dielectric layer and an etch stop layer sequentially over the substrate and a second dielectric layer over the etch stop layer said etch stop layer simultaneously serves as a floor of trench and passivates a sidewall of a capacitator
   forming said capacitor interposed between the first dielectric layer and the second dielectric layer, where the capacitor is also formed sandwiched between a first conductor stud that penetrates the first dielectric layer and contacts the first contact region and a second conductor stud that penetrates the second dielectric layer; and
   forming a contiguous conductor interconnect and conductor stud layer contacting the second contact region and into a trench defined within the second dielectric layer and a contiguous via defined within the first dielectric layer.

2. The method of claim 1 wherein at least one of the first dielectric layer and the second dielectric layer is formed of a comparatively low dielectric constant dielectric material.

3. The method of claim 2 wherein the etch stop layer is formed of a silicon nitride material.

4. The method of claim 1 further comprising forming a spacer layer passivating a sidewall of the capacitor.

5. The method of claim 1 wherein a second via into which is formed the second stud is formed in part simultaneously with the via contiguous with the trench.

6. The method of claim 1 wherein the second stud is formed simultaneously with the contiguous conductor interconnect and conductor stud layer.

* * * * *